United States Patent
Hill et al.

(10) Patent No.: US 7,808,048 B1
(45) Date of Patent: Oct. 5, 2010

(54) SYSTEM AND METHOD FOR PROVIDING A BURIED THIN FILM RESISTOR HAVING END CAPS DEFINED BY A DIELECTRIC MASK

(75) Inventors: Rodney Hill, Mansfield, TX (US); Victor Torres, Irving, TX (US); William Max Coppock, Arlington, TX (US); Richard W. Foote, Jr., Kennedale, TX (US); Terry L. Lines, Mansfield, TX (US); Tom Bold, Roanoke, TX (US)

(73) Assignee: National Semiconductor Corporation, Santa Clara, CA (US)

( * ) Notice: Subject to any disclaimer, the term of this patent is extended or adjusted under 35 U.S.C. 154(b) by 395 days.

(21) Appl. No.: 11/974,647

(22) Filed: Oct. 15, 2007

Related U.S. Application Data

(62) Division of application No. 11/179,022, filed on Jul. 11, 2005, now Pat. No. 7,332,403.

(51) Int. Cl.
  *H01L 23/62* (2006.01)
(52) U.S. Cl. .................. 257/358; 257/359; 257/379; 257/E27.047
(58) Field of Classification Search ......... 257/379–380, 257/581–582, 358–359, E27.047
See application file for complete search history.

(56) References Cited

U.S. PATENT DOCUMENTS

| | | | |
|---|---|---|---|
| 5,547,896 A | 8/1996 | Lin et al. | |
| 6,097,095 A | 8/2000 | Chung | |
| 6,117,789 A | 9/2000 | Lee | |
| 6,279,585 B1 * | 8/2001 | Shiraki et al. | 134/1.3 |
| 6,326,256 B1 | 12/2001 | Bailey et al. | |
| 6,365,480 B1 * | 4/2002 | Huppert et al. | 438/381 |
| 6,645,821 B2 | 11/2003 | Bailey et al. | |
| 7,410,879 B1 | 8/2008 | Hill et al. | |
| 2002/0102806 A1 * | 8/2002 | Bailey et al. | 438/384 |
| 2004/0140508 A1 | 7/2004 | Sengoku et al. | |

OTHER PUBLICATIONS

Rodney Hill, et al., "System and Method for Providing a Dual Via Architecture for Thin Film Resistors", U.S. Appl. No. 12/217,877, filed Jul. 9, 2008.

* cited by examiner

*Primary Examiner*—H. Jey Tsai

(57) ABSTRACT

A buried thin film resistor having end caps defined by a dielectric mask is disclosed. A thin film resistor is formed on an integrated circuit substrate. A resistor protect layer is formed over the thin film resistor. A layer of dielectric material is formed over the resistor protect layer. The dielectric material is masked and dry etched to leave a first portion of dielectric material over a first end of the thin film resistor and a second portion of dielectric material over a second end of the thin film resistor. The resistor protect layer is then wet etched using the first and second portions of the dielectric material as a hard mask. Then a second dielectric layer is deposited and vias are etched down to the underlying portions of the resistor protect layer.

20 Claims, 7 Drawing Sheets

SYSTEM AND METHOD FOR PROVIDING A BURIED THIN FILM RESISTOR HAVING END CAPS DEFINED BY A DIELECTRIC MASK

This application is a divisional of prior U.S. patent application Ser. No. 11/179,022 filed on Jul. 11, 2005 now U.S. Pat. No. 7,332,403.

TECHNICAL FIELD OF THE INVENTION

The present invention is generally directed to semiconductor technology and, in particular, to thin film resistors and methods for manufacturing thin film resistors.

BACKGROUND OF THE INVENTION

In recent years, there have been great advancements in the speed, power, and complexity of integrated circuits. Some types of integrated circuits comprise thin film resistors. When integrated circuit devices that contain thin film resistors are manufactured, different methods may be employed for manufacturing the thin film resistors.

In some prior art methods for manufacturing a thin film resistor the thin film resistor is located at the same level as a conductor interconnect layer. A major disadvantage of this design is that a resistor protect layer (e.g., titanium tungsten (TiW)) that covers the thin film resistor has a topography from which the conductor interconnect layer must be etched away. The resistor protect layer etches in the same dry etch chemistry as the interconnect conductor. This presents a dilemma in that in order to reduce the step height, a thinner resistor protect metal layer is needed. But a layer that is thin enough that will not leave conductive stringers is too thin to survive the conductor dry etch process.

In U.S. Pat. No. 6,645,821 a method is disclosed for manufacturing a buried thin film resistor having end caps defined by a resist mask. A major disadvantage of this design is that a resist mask is incompatible with many of the etchants that are used to remove the resistor protect layer. For example, the thin film resistor in U.S. Pat. No. 6,645,821 states that a resistor protect layer of titanium tungsten can be etched with hydrogen peroxide in a resist pattern. This is a problem because the resist material etches in hydrogen peroxide. This makes the resist material unsuitable as a masking material.

Therefore, there is a need in the art for an efficient system and method for efficiently providing a resistor protect layer that is able to protect a thin film resistor during the steps of a manufacturing process.

SUMMARY OF THE INVENTION

To address the above-discussed deficiencies of the prior art, it is a primary object of the present invention to provide a system and method for efficiently manufacturing a thin film resistor apparatus in an integrated circuit.

The thin film resistor apparatus of the present invention comprises a buried thin film resistor having end caps defined by a dielectric mask. The thin film resistor apparatus of the present invention is manufactured by first forming a thin film resistor on an integrated circuit substrate. A resistor protect layer is then formed over the thin film resistor. In an advantageous embodiment the thin film resistor material comprises silicon carbide chromium (SiCCr) and the resistor protect layer comprises titanium tungsten (TiW).

A layer of first dielectric material (e.g., silicon oxide) is then formed over the resistor protect layer. The first dielectric material is then masked and dry etched to leave a first portion of first dielectric material over a first end of the thin film resistor and a second portion of first dielectric material over a second end of the thin film resistor. Then the resistor protect layer is wet etched using the first and second portions of the first dielectric material as a hard mask.

Then a second dielectric layer is deposited over the thin film resistor and over the first and second portions of the first dielectric material. A first via is then etched though the second dielectric layer and through the first portion of the first dielectric material down to the portion of the resistor protect layer that is located over the first end of the thin film resistor.

A second via is etched through the second dielectric layer and through the second portion of the first dielectric material down to the portion of the resistor protect layer that is located over the second end of the thin film resistor.

Then the first and second vias are filled with a conductor layer to provide electrical connections to the first and second ends of the buried thin film resistor.

It is an object of the present invention to provide a method for efficiently manufacturing a thin film resistor apparatus in an integrated circuit.

It is also an object of the present invention to provide a method for efficiently providing a resistor protect layer to protect a thin film resistor during the steps of a manufacturing process.

It is another object of the present invention to provide a method for forming first and second portions of a first dielectric layer over respective first and second portions of a resistor protect layer that are located over respective first and second ends of a thin film resistor.

It is another object of the present invention to provide a method for etching portions of a resistor protect layer using first and second portions of a first dielectric layer as a hard mask.

The foregoing has outlined rather broadly the features and technical advantages of the present invention so that those persons who are skilled in the art may better understand the detailed description of the invention that follows. Additional features and advantages of the invention will be described hereinafter that form the subject of the claims of the invention. Persons who are skilled in the art should appreciate that they may readily use the conception and the specific embodiment disclosed as a basis for modifying or designing other structures for carrying out the same purposes of the present invention. Persons who are skilled in the art should also realize that such equivalent constructions do not depart from the spirit and scope is of the invention in its broadest form.

Before undertaking the Detailed Description of the Invention below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely.

The term "conductor" means any electrically conducting material. The term "conductor" includes but is not limited to metals and metal stacks composed of aluminum, titanium, titanium nitride, tantalum nitride, copper, or tungsten as well as non-metals like polysilicon or doped polysilicon.

Definitions for certain words and phrases are provided throughout this patent document, those persons of ordinary skill in the art should understand that in many, if not most instances, such definitions apply to prior uses, as well as future uses, of such defined words and phrases.

BRIEF DESCRIPTION OF THE DRAWINGS

For a more complete understanding of the present invention and its advantages, reference is now made to the following description taken in conjunction with the accompanying drawings, in which like reference numerals represent like parts.

DETAILED DESCRIPTION OF THE INVENTION

FIGS. 1 through 22, discussed below, and the various embodiments used to describe the principles of the present invention in this patent document are by way of illustration only and should not be construed in any way to limit the scope of the invention. Persons who are skilled in the art will understand that the principles of the present invention may be implemented in any type of suitably arranged semiconductor device.

Figure 1:
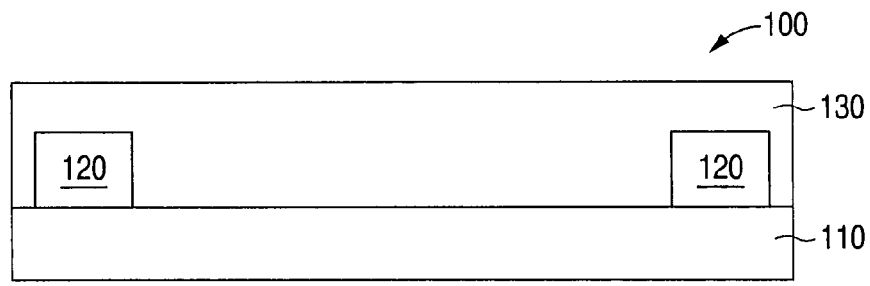
FIG. 1 illustrates a substrate comprising a first substrate oxide layer, a first conductor layer, and a second substrate oxide layer that covers the first substrate oxide layer and the first conductor layer for use in manufacturing a semiconductor device according to the principles of the present invention.

FIG. 1 illustrates a substrate 100 for use in manufacturing a semiconductor device according to the principles of the present invention. The foundation of substrate 100 comprises a first substrate oxide layer 110 on which a patterned first conductor layer 120 is formed. Substrate 100 further comprises a second substrate oxide layer 130 that covers the first substrate oxide layer 110 and the first conductive layer 120.

In an advantageous embodiment of the invention the upper surface of the second substrate oxide layer 130 is substantially flat. The upper surface of the second substrate oxide layer 130 may be planarized by a chemical mechanical polishing (CMP) procedure. In the illustrative example shown in FIG. 1 the insulating layer of substrate material is a layer of oxide. It is understood that the use of oxide is merely illustrative and that the insulating layer of substrate material may be made of any suitable dielectric material.

Figure 2:
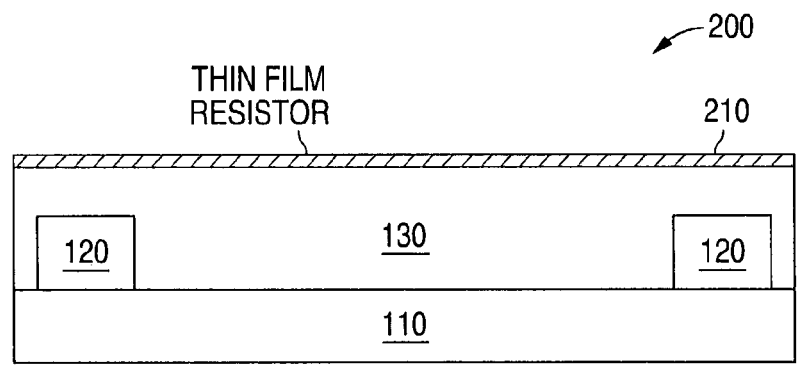
FIG. 2 illustrates the substrate shown in FIG. 1 in which a layer of thin film resistor material has been deposited on the surface of the second substrate oxide layer.

In the next step of the manufacturing method of the invention a layer of thin film resistor material is deposited. In an advantageous embodiment of the invention the thin film resistor material comprises silicon carbide chromium (SiCCr). The thin film resistor material may comprise silicon chromium (SiCr), nickel chromium (NiCr), titanium nitride (TiN) or tantalum nitride (TaN). FIG. 2 illustrates a device 200 in which a layer of thin film resistor material 210 has been deposited on the surface of the second substrate oxide layer 130 of the substrate 100. In an advantageous embodiment of the invention the thickness of the thin film resistor material 210 is approximately ninety Ångstroms (90 Å).

Figure 3:
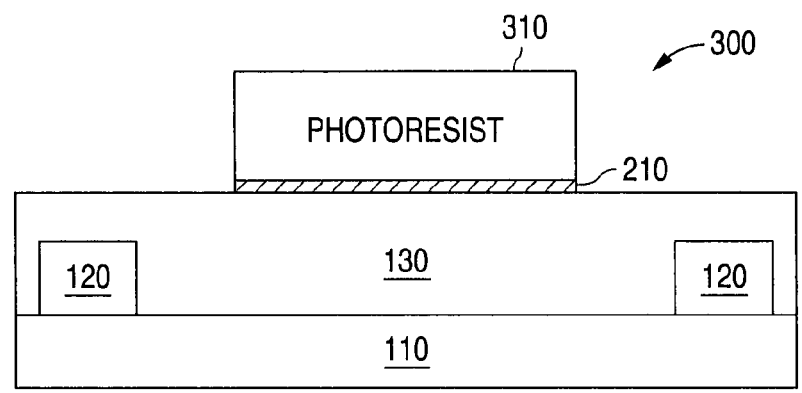
FIG. 3 illustrates the device shown in FIG. 2 in which a photoresist mask has been applied to cover the thin film resistor material and an etch process has been applied to etch away the exposed portions of the thin film resistor material.

In the next step of the manufacturing method of the invention the layer of thin film resistor material 210 is masked and etched. A photoresist mask 310 is applied to cover the portions of the thin film resistor material 210 that will form the thin film resistor. A conventional etch process is then applied to etch away the exposed portions of the thin film resistor material 210. FIG. 3 illustrates a device 300 that shows the location of the photoresist mask 310 over the thin film resistor material 210. FIG. 3 also illustrates the result of applying the etch process to etch away the exposed portions of the thin film resistor material 210.

Figure 4:
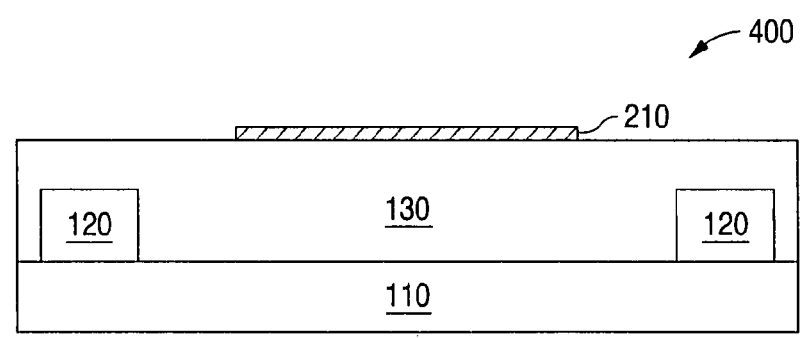
FIG. 4 illustrates the device shown in FIG. 3 in which the photoresist mask has been stripped away.

In the next step of the manufacturing method of the invention the photoresist mask 310 is stripped away. FIG. 4 illustrates a device 400 that results after the photoresist mask 310 has been stripped away.

Figure 5:
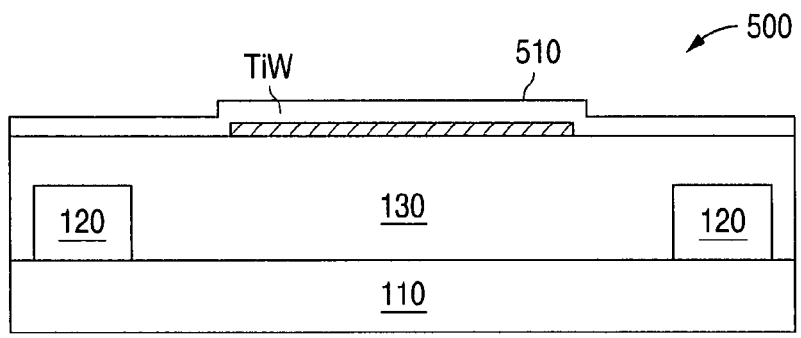
FIG. 5 illustrates the device shown in FIG. 4 in which a layer of titanium tungsten has been deposited to cover the thin film resistor material and the exposed portions of the second substrate oxide layer.

In the next step of the manufacturing method of the invention a resistor protect layer is applied. In an advantageous embodiment of the invention the resistor protect layer comprises titanium tungsten (TiW). The resistor protect layer may also comprise tungsten (W), aluminum (Al), titanium nitride (TiN) or molybdenum (Mo). FIG. 5 illustrates a device 500 in which a layer of titanium tungsten (TiW) 510 has been deposited to cover the thin film resistor material 210 and the exposed portions of the second substrate oxide layer 130. In an advantageous embodiment of the invention the thickness of the layer of titanium tungsten (TiW) 510 is approximately three thousand five hundred Ångstroms (3,500 Å).

The layer of titanium tungsten (TiW) 510 must wet etch easily in a solution that does not attack the thin film resistor material 210. A dry etch process that ends on the thin film resistor material 210 will create undesirable variations in the electrical resistance, resistor matching or physical dimensions of the thin film resistor material 210. Likewise, a dry etch process that simultaneously defines the resistor and resistor protect layers (i.e., elimination of one mask and one etch step) will create undesirable variations in the electrical resistance, resistor matching or physical dimensions of the thin film resistor material 210. The layer of titanium tungsten (TiW) 510 must protect the thin film resistor material 210 during the patterning of the next layer and during a subsequent via etch process.

Figure 6:
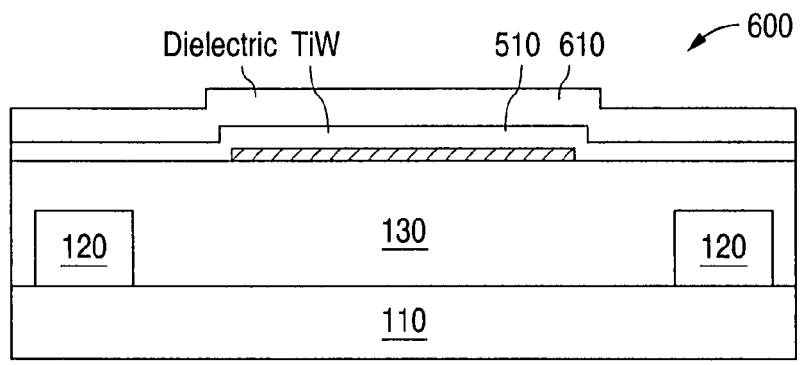
FIG. 6 illustrates the device shown in FIG. 5 in which a first dielectric layer has been deposited to cover the layer of titanium tungsten.

In the next step of the manufacturing method of the invention a relatively thin first dielectric layer is applied. FIG. 6 illustrates a device 600 in which a thin first dielectric layer 610 has been deposited to cover the thin layer of titanium tungsten (TiW) 510. In an advantageous embodiment of the invention the material of the first dielectric layer 610 comprises silicon oxide (SiO). It is understood that any suitable dielectric material may also be used. In an advantageous embodiment of the invention the thickness of the first dielectric layer 610 is approximately one thousand three hundred Ångstroms (1,300 Å).

The relatively thin first dielectric layer 610 will be used as a hard mask during a subsequent etching of resistor protect layer 510. The chemical solutions that are used to wet etch the titanium tungsten (TiW) layer 510 are not compatible with using photoresist only as a mask.

Figure 7:
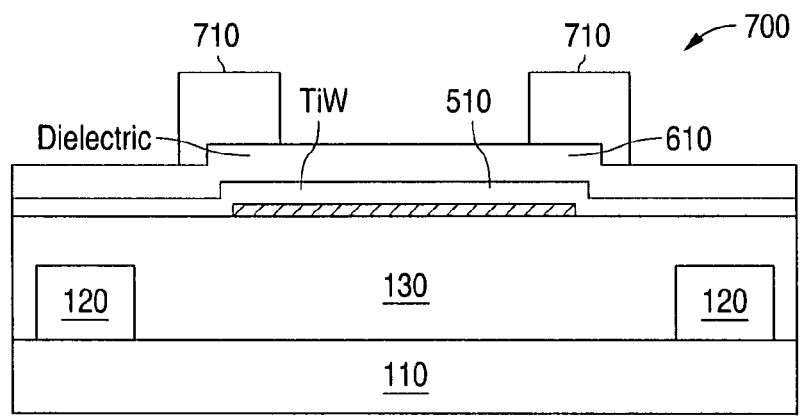
FIG. 7 illustrates the device shown in FIG. 6 in which a patterned resistor protect photoresist mask has been applied to cover portions of the first dielectric layer that are located at the ends of the thin film resistor material.

In the next step of the manufacturing method of the invention a patterned resistor protect photoresist mask 710 is applied to cover portions of the first dielectric layer 610 that are located at the ends of the thin film resistor 210. FIG. 7 illustrates a device 700 showing the location of photoresist mask 710. The pattern of the photoresist mask 710 covers the first dielectric layer 610 and the titanium tungsten (TiW) layer 510 at the ends of the thin film resistor 210. The unetched portion forms the headers (or end caps) in the first dielectric layer 610. Photoresist mask 710 does not cover the full length of the thin film resistor 210.

The thickness of first dielectric layer 610 and the thickness of the titanium tungsten (TiW) layer 510 shown in the drawings have not been drawn to scale. The dimensions of the thicknesses have been exaggerated for clarity in the drawings. Therefore the "step height" of the first dielectric layer 610 over the titanium tungsten (TiW) layer 510 (at the ends of the thin film resistor 210) is not large. The "step height" is only approximately one hundred Ångstroms (100 Å) to approximately two hundred Ångstroms (200 Å).

Figure 8:
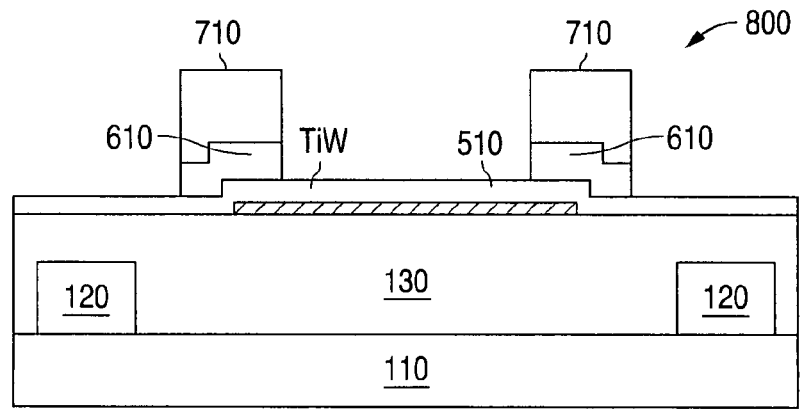
FIG. 8 illustrates the result of performing a dry dielectric etch process to the device shown in FIG. 7 in which the etch process stops on the titanium tungsten layer.

In the next step of the manufacturing method of the invention a dry etch process is used to etch the first dielectric layer 610. FIG. 8 illustrates a device 800 showing the result of performing a dry etch process to the first dielectric layer 610. The etch process stops on the titanium tungsten (TiW) layer 510.

Figure 9:
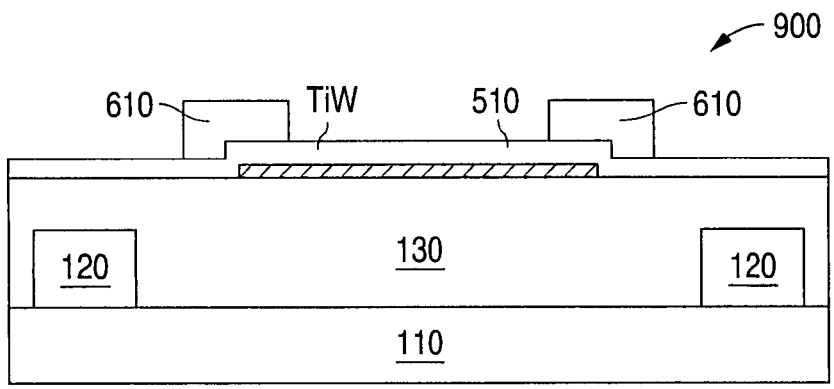
FIG. 9 illustrates the result of stripping away the patterned resistor protect photoresist mask from the device shown in FIG. 8.

In the next step of the manufacturing method of the invention the resistor protect photoresist mask 710 is stripped away. FIG. 9 illustrates a device 900 that results after the resistor protect photoresist mask 710 has been stripped away.

Figure 10:
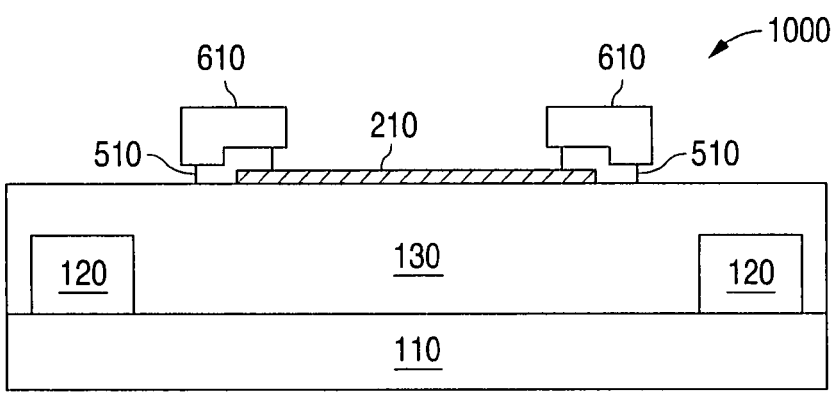
FIG. 10 illustrates the result of performing a wet titanium tungsten etch process to the device shown in FIG. 9 in which the first dielectric layer serves as a hard mask.

In the next step of the manufacturing method of the invention a wet etch process is used to etch the titanium tungsten (TiW) layer 510. Hydrogen peroxide ($H_2O_2$) is commonly used to perform a wet etch on titanium tungsten (TiW). FIG. 10 illustrates a device 1000 showing the result of performing a wet etch process to the device 900 shown in FIG. 9. The first dielectric layer 610 serves as a hard mask for the wet etch process.

FIG. 10 shows that the portions of the titanium tungsten (TiW) layer 510 that previously covered the central portion of the thin film resistor 210 have been etched away. Similarly, FIG. 10 shows that the portions of the titanium tungsten (TiW) layer 510 that previously covered the second substrate oxide layer 130 have also been etched away. The only portions of the titanium tungsten (TiW) layer 510 that remain are those portions that are located under the remaining portions of the first dielectric layer 610 at the ends of the thin film resistor 210.

Figure 11:
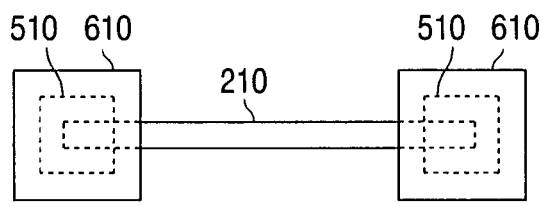
FIG. 11 illustrates a plan view of the thin film resistor portion of the device shown in FIG. 10.

FIG. 11 illustrates a plan view of the thin film resistor 210 of the device 1000 shown in FIG. 10. Each end of thin film resistor 210 is located under (and is in electrical contact with) a remaining "end cap" portion of the titanium tungsten (TiW) layer 510. Each remaining end cap portion of the titanium tungsten (TiW) layer 510 is located under its respective remaining "end cap" portion of the first dielectric layer 610.

Figure 12:
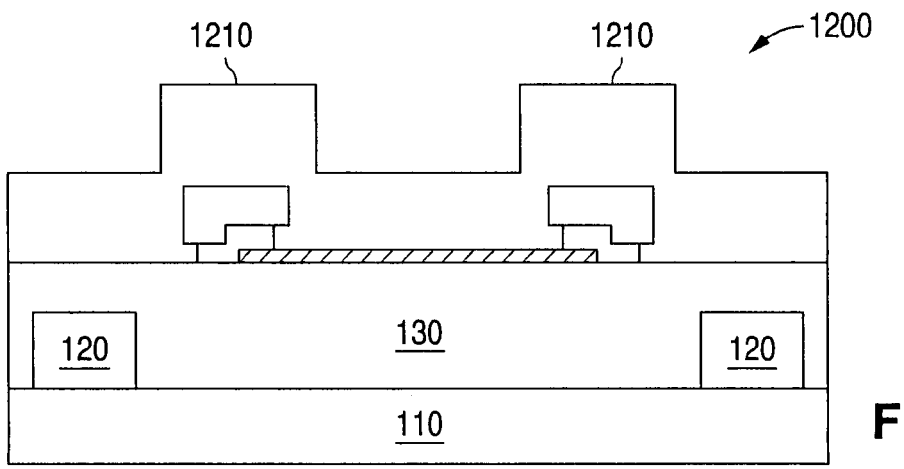
FIG. 12 illustrates the result of depositing a second dielectric layer over the device shown in FIG. 10.

In the next step of the manufacturing method of the invention a second dielectric layer 1210 is deposited over the device 1000 that is shown in FIG. 10. FIG. 12 illustrates a device 1200 that results after second dielectric layer 1210 has been deposited. The second dielectric layer 1210 must be thick enough to protect the thin film resistor 210 during a subsequent metal overetch process.

In an advantageous embodiment of the invention the thickness of the second dielectric layer 1210 is approximately three thousand five hundred Ångstroms (3,500 Å). The step height of the second dielectric layer 1210 over the ends of the thin film resistor 210 will be determined by the total thickness of the thin film resistor 210, the titanium tungsten (TiW) layer 510, and the first dielectric layer 610.

Figure 13:
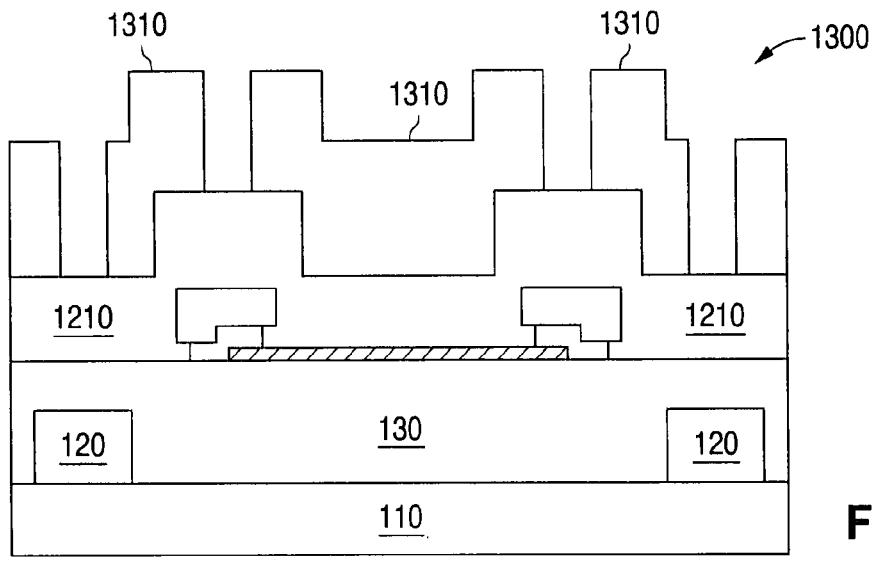
FIG. 13 illustrates the result applying a via resist mask over the device shown in FIG. 12.

In the next step of the manufacturing method of the invention a via resist mask 1310 is formed over the device 1200 that is shown in FIG. 12. FIG. 13 illustrates a device 1300 that results after the via resist mask 1310 has been formed. The via resist mask 1310 may be formed by a conventional photolithographic manufacturing process.

In the next step of the manufacturing method of the invention a dry etch process is applied to etch vias (1) down to the titanium tungsten (TiW) layer 510 that is located over the ends of the thin film resistor 210 and (2) down to the first conductor layer 120. The dry etch process etches through both the second dielectric layer 1210 and the first dielectric layer 610 down to the titanium tungsten (TiW) layer 510.

Figure 14:
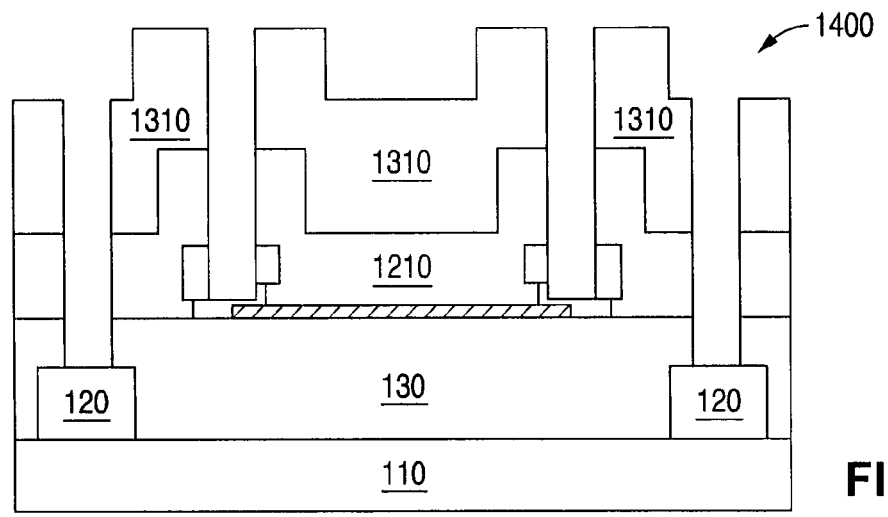
FIG. 14 illustrates the result of applying a dry etch process to the device shown in FIG. 13 to etch vias down to the titanium tungsten layer over the ends of the thin film resistor and down to the first conductor layer.

Because the dry etch process also etches through both the second dielectric layer 1210 and the second substrate oxide layer 130 down to the first conductor layer 120, the thickness of the titanium tungsten (TiW) layer 510 must be thick enough so that the titanium tungsten (TiW) will last through the added overetch that is required to reach the first conductor layer 120. The selectivity of a dry etch process for etching an oxide material (a dielectric material) versus etching titanium tungsten (TiW) material is very high. FIG. 14 illustrates a device 1400 that shows the result of applying the dry etch process to etch the vias as described.

Figure 15:
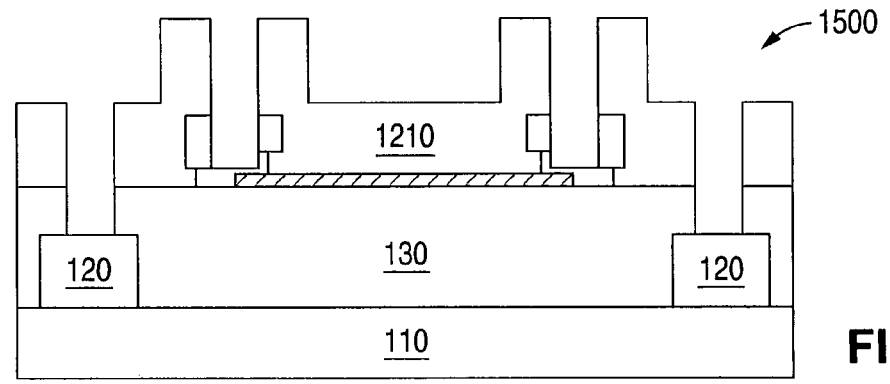
FIG. 15 illustrates the result of stripping away the via resist mask from the device shown in FIG. 14.

In the next step of the manufacturing method of the invention the via resist mask 1310 is stripped away. FIG. 15 illustrates a device 1500 that results after the via resist mask 1310 has been stripped away from the device 1400 shown in FIG. 14.

Figure 16:
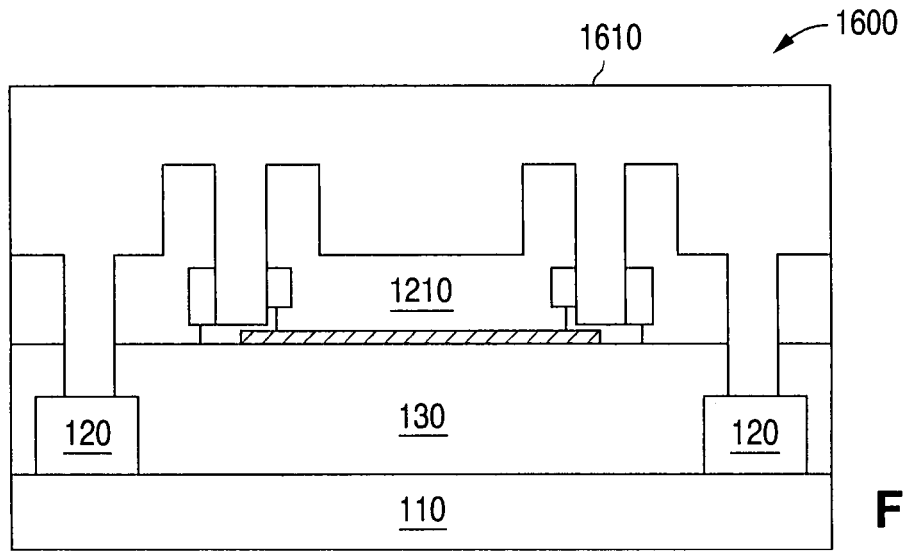
FIG. 16 illustrates the result of depositing a second conductor layer over the device shown in FIG. 15.

In the next step of the manufacturing method of the invention a second conductor layer 1610 is deposited over the device 1500 that is shown in FIG. 15. FIG. 16 illustrates a device 1600 that results after the second conductor layer 1610 has been deposited. The material of the second conductor layer 1610 fills the vias down to the titanium tungsten (TiW) layer 510 that is located over the ends of the thin film resistor 210. The material of the second conductor layer 1610 also fills the vias down to the first conductor layer 120.

Figure 17:
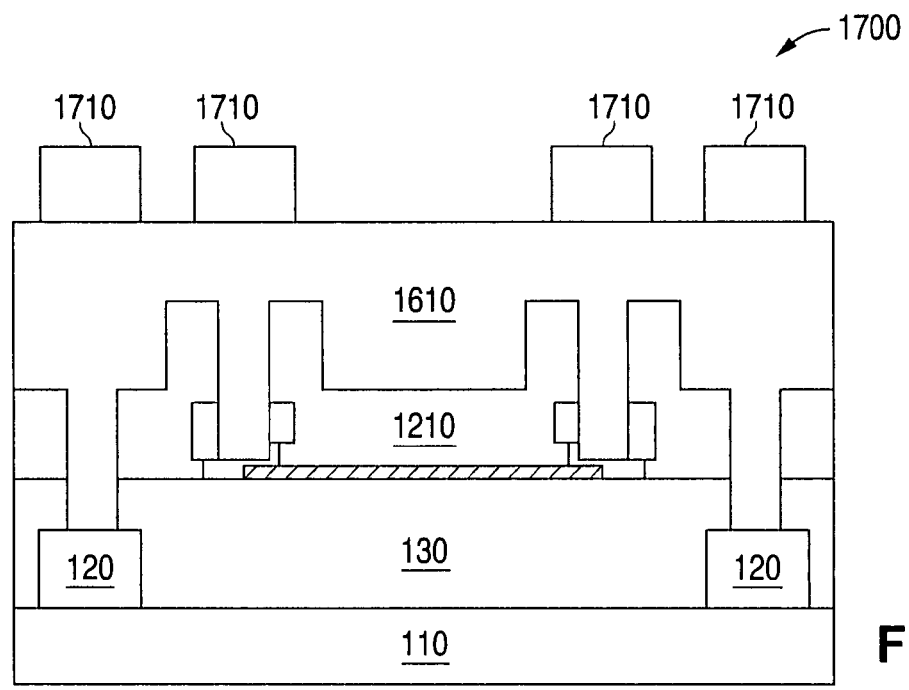
FIG. 17 illustrates the result applying a metal etch resist mask over the second conductor layer of the device shown in FIG. 16.

In the next step of the manufacturing method of the invention a metal etch resist mask 1710 is formed over the second conductor layer 1610. FIG. 17 illustrates a device 1700 that results after the metal etch resist mask 1710 has been formed over the second conductor layer 1610. The metal etch resist mask 1710 may be formed by a conventional photolithographic manufacturing process. As shown in FIG. 17, the portions of metal etch resist mask 1710 are located over the locations of the conductor filled vias.

Figure 18:
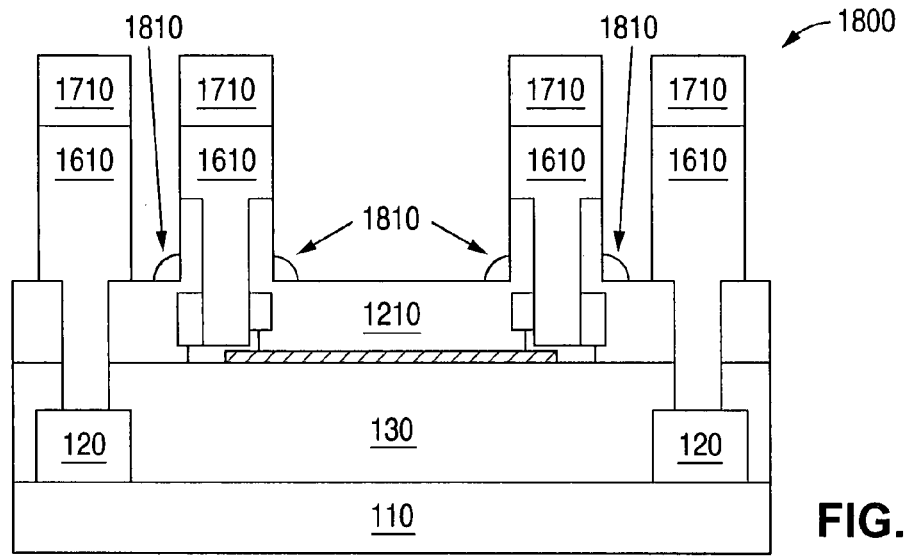
FIG. 18 illustrates the result of applying a metal etch process to the device shown in FIG. 17 to etch away portions of the second conductor layer down to the second dielectric layer.

In the next step of the manufacturing method of the invention a metal etch process is applied to etch away portions of the second conductor layer 1610 that are not covered by the metal etch mask 1710. FIG. 18 illustrates a device 1800 that results from applying the metal etch process to etch away portions of the second conductor layer 1610. The second conductor layer 1610 is etched away down to the second dielectric layer 1210.

The metal etch process may leave stringers 1810 of the second conductor layer 1610 on the surface of the second dielectric layer 1210. The stringers 1810 may surround the column of second dielectric layer 1210 material that supports the vias of second conductor layer 1610. If stringers 1810 are formed they do not short along the thin film resistor 210. The thin film resistor 210 is protected by the insulation that is provided by the second dielectric layer 1210.

Figure 19:
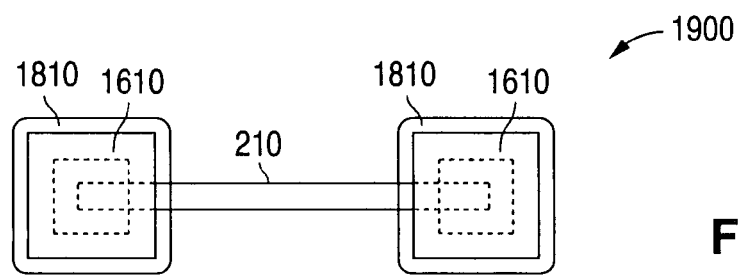
FIG. 19 illustrates a plan view of the thin film resistor portion of the device shown in FIG. 18 showing one possible location of conductive stringers that may be left by the metal etch process.

FIG. 19 illustrates a plan view of the thin film resistor portion of the device shown in FIG. 18 showing a possible location of conductive stringers 1810 that may be left by the metal etch process. In the embodiment shown in FIG. 19 the conductive stringers 1810 form a ring of conductive material located around the column of second dielectric layer 1210 material that supports the vias of second conductor layer 1610. The squares in dotted outline in FIG. 19 represent the columns of second conductor layer 1610 that are located within the two vias.

Figure 20:
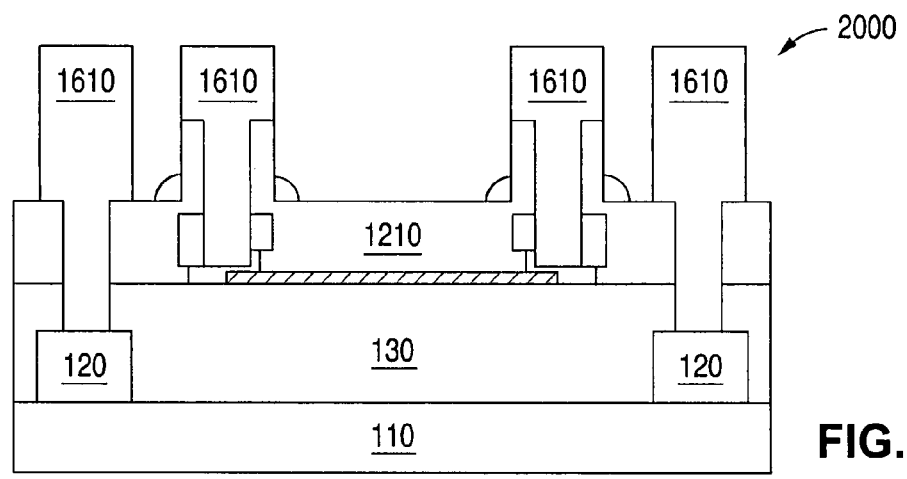
FIG. 20 illustrates the result of stripping away the metal etch resist mask from the device shown in FIG. 18.

In the next step of the manufacturing method of the invention the metal etch mask 1710 is stripped away. FIG. 20 is illustrates a device 2000 that results after the metal etch mask 1710 has been stripped away from the device 1800 shown in FIG. 18.

Figure 21:
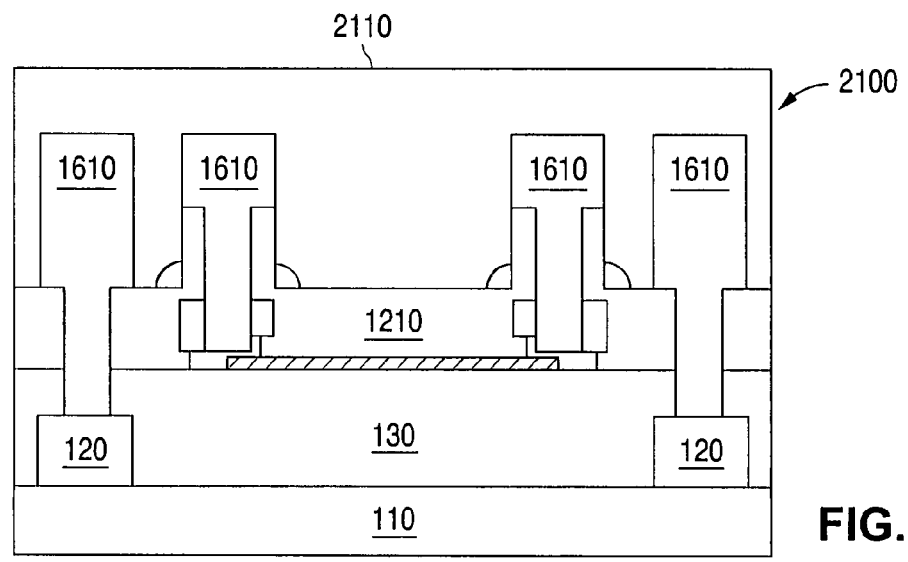
FIG. 21 illustrates the result of applying a passivation layer to the device shown in FIG. 20.

In the next step of the manufacturing method of the invention a passivation layer 2110 is deposited over the device 2000 that is shown in FIG. 20. FIG. 21 illustrates a device 2100 that results after the passivation layer 2110 has been deposited. The passivation layer 2110 may be subsequently masked and etched using conventional techniques to access the underlying via structures.

Figure 22:
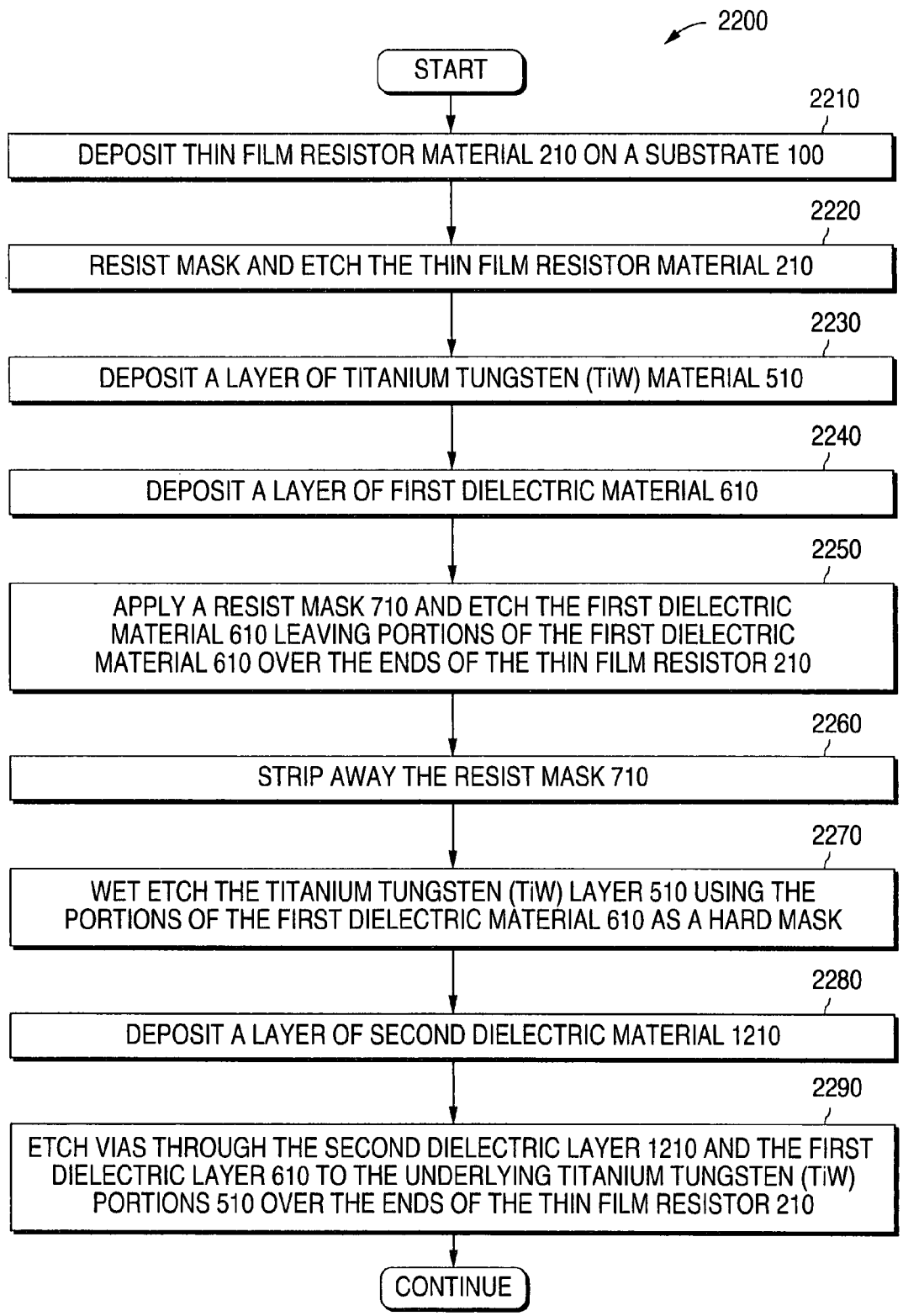
FIG. 22 illustrates an advantageous embodiment of a method of the present invention.

FIG. 22 illustrates an advantageous embodiment of a method of the present invention. The steps of the invention shown in FIG. 22 are collectively designated with reference numeral 2200. The method of the present invention begins with a deposition of thin film resistor material 120 on a substrate 100 (step 2210). Then a resist mask is deposited and the thin film material 210 is etched (step 2220). Then a layer of titanium tungsten (TiW) material 510 is deposited (step 2230). Then a layer of first dielectric material 610 is deposited (step 2240).

In the next step of the method a resist mask 710 is applied and the first dielectric material 610 is etched leaving portions of the first dielectric material 610 over the ends of the thin film resistor 210 (step 2250). Then the resist mask 710 is stripped away (step 2260). Then the titanium tungsten (TiW) layer 510 is wet etched using the portions of the first dielectric material 610 as a hard mask (step 2270). Then a layer of second dielectric material 1210 is deposited (step 2280).

Then a mask and etch process is employed to etch vias through the second dielectric layer 1210 and through the first dielectric layer 610 to the underlying titanium tungsten (TiW) portions 510 that are located over the ends of the thin film resistor 210 (step 2290). Conventional techniques are then used to fill the vias with conductor material to provide electrical connections to the ends of the thin film resistor 210.

The present invention has been described for an embodiment in which there are two vias, each of which is etched to one of the two ends of a thin film resistor. It is understood that for different design requirements the system and method of the invention may also be applied to etch a via to only one end of a thin film resistor. In such a case the other end of the thin film resistor would be electrically connected to other circuit elements using a different method.

The present invention has several advantages over the techniques that exist in the prior art. For example, the present invention provides better length control (i.e., better resistance control) using a hard mask in place of a resist mask to minimize the variation in header size, consequently reducing the variation in the length of the resistor and improving the resistor matching. Wet etching titanium tungsten (TiW) in hydrogen peroxide is incompatible with a resist mask and would lead to very poor control of the resistor properties.

The present invention does not produce any topographic steps that could cause thin film resistor shorts. A further advantage of the present invention is using separate masking and etch steps to define the resistor and the resistor protect. This allows for overlap of the resistor by the resistor protect layer. This prevents the resistor edges from being exposed to processing and leads to better control of the resistor protect properties (e.g., matching and resistances).

In dry etching there is a poor selectivity between the interconnect conductor layer 1610 and the thin film resistor 210. The layer of interconnect conductor in an interconnect stack tends to be relatively thick. Therefore, if a prior art wet etch method is used the wet etch has to be used for a relatively long period of time. The longer a wet etch process continues, the larger the variations are in the dimensions of the thin film resistor as defined by the final end cap spacing. The present invention takes advantage of the wet etch selectivity but improves the thin film resistor dimensional control by using a thin titanium tungsten (TiW) layer (short wet etch required) to make contact to the thin film resistor material.

In addition, modern interconnect layers are not all made of a single film of material. There may be a number of different materials in an interconnect layer. For example, there may be titanium (Ti), titanium nitride (TiN), aluminum (Al), titanium tungsten (TiW), etc. Finding a wet etch that would deal with all the different layers is nearly impossible. One would have to do multiple wet etches in order to deal with the different materials in the stack, and still find an etch process that would not attack the thin film resistor during the wet etching of the interconnect stack.

Although the present invention has been described with an exemplary embodiment, various changes and modifications may be suggested to one skilled in the art. It is intended that the present invention encompass such changes and modifications as fall within the scope of the appended claims.

What is claimed is:

1. A thin film resistor apparatus in an integrated circuit, the apparatus comprising:
    a thin film resistor material over an integrated circuit substrate;
    a first portion of a resistor protect material over a first end of the thin film resistor material;
    a second portion of the resistor protect material over a second end of the thin film resistor material;
    a first portion of a first dielectric material over the first portion of the resistor protect material;
    a second portion of the first dielectric material over the second portion of the resistor protect material;
    a second dielectric material over the thin film resistor material and between the first and second portions of the first dielectric material;
    a first via through the second dielectric material and through the first portion of the first dielectric material down to the first portion of the resistor protect material;
    a second via through the second dielectric material and through the second portion of the first dielectric material down to the second portion of the resistor protect material; and
    a conductive material that fills the first and second vias, the conductive material also forming one or more stringers separated from the filled vias and from the thin film resistor material by the second dielectric material.

2. The apparatus as set forth in claim 1, wherein the thin film resistor material comprises one of: silicon chromium (SiCr), silicon carbide chromium (SiCCr), nickel chromium (NiCr), titanium nitride (TiN), and tantalum nitride (TaN).

3. The apparatus as set forth in claim 1, wherein the resistor protect material comprises one of: tungsten, titanium tungsten, titanium nitride, aluminum, and molybdenum.

4. An integrated circuit comprising:
    a thin film resistor material;
    a first portion of a resistor protect material over a first portion of the thin film resistor material;
    a second portion of the resistor protect material over a second portion of the thin film resistor material;
    a first portion of a first dielectric material over the first portion of the resistor protect material;
    a second portion of the first dielectric material over the second portion of the resistor protect material;
    a second dielectric material over the thin film resistor material and between the first and second portions of the first dielectric material, the second dielectric material and the first portion of the first dielectric material including a first via down to the first portion of the resistor protect material, the second dielectric material and the second portion of the first dielectric material including a second via down to the second portion of the resistor protect material; and
    a conductive material within the first and second vias, the conductive material also forming one or more stringers that are separated from the thin film resistor material by the second dielectric material.

5. The integrated circuit of claim 4, wherein the first and second portions of the resistor protect material are separated from one another and are located over opposing ends of the thin film resistor material.

6. The integrated circuit of claim 4, wherein the first and second portions of the first dielectric material are separated from one another and are located over opposing ends of the thin film resistor material.

7. The integrated circuit of claim 4, wherein the first and second dielectric materials comprise silicon oxide.

8. The integrated circuit of claim 4, wherein:
    the conductive material is associated with a conductive layer etched during production of the integrated circuit; and
    the one or more stringers are formed during the etching of the conductive layer.

9. The integrated circuit of claim 4, further comprising:
    a passivation layer over the second dielectric material and the conductive material.

10. The integrated circuit of claim 4, wherein:
    the thin film resistor material comprises at least one of: silicon chromium, silicon carbide chromium, nickel chromium, titanium nitride, and tantalum nitride; and
    the resistor protect material comprises at least one of: tungsten, titanium tungsten, titanium nitride, aluminum, and molybdenum.

11. An apparatus comprising a plurality of integrated circuits, the integrated circuits including a thin film resistor that comprises:
    a thin film resistor material;
    a first portion of a resistor protect material over a first portion of the thin film resistor material;
    a second portion of the resistor protect material over a second portion of the thin film resistor material;
    a first portion of a first dielectric material over the first portion of the resistor protect material;
    a second portion of the first dielectric material over the second portion of the resistor protect material;
    a second dielectric material over the thin film resistor material and between the first and second portions of the first dielectric material, the second dielectric material and the first portion of the first dielectric material including a first via down to the first portion of the resistor protect material, the second dielectric material and the second portion of the first dielectric material including a second via down to the second portion of the resistor protect material; and
    a conductive material within the first and second vias, the conductive material also forming one or more stringers that are separated from the thin film resistor material by the second dielectric material.

12. The apparatus of claim 11, wherein:
    the first and second portions of the resistor protect material are separated from one another and are located over opposing ends of the thin film resistor material; and
    the first and second portions of the first dielectric material are separated from one another and are located over the opposing ends of the thin film resistor material.

13. The apparatus of claim 11, wherein:
    the conductive material is associated with a conductive layer etched during production of the thin film resistor; and
    the one or more stringers are formed during the etching of the conductive layer.

14. The apparatus of claim 11, wherein:
the thin film resistor material comprises at least one of: silicon chromium, silicon carbide chromium, nickel chromium, titanium nitride, and tantalum nitride; and
the resistor protect material comprises at least one of: tungsten, titanium tungsten, titanium nitride, aluminum, and molybdenum.

15. The apparatus as set forth in claim 1, wherein:
the second dielectric material comprises first and second columns containing at least part of the filled vias; and
the one or more stringers comprise a first stringer surrounding the first column and a second stringer surrounding the second column.

16. The apparatus as set forth in claim 1, wherein the conductive material in the vias and the conductive material in the one or more stringers comprise portions of a single conductive layer.

17. The integrated circuit of claim 4, wherein:
the second dielectric material comprises first and second columns containing at least part of the vias; and
the one or more stringers comprise a first stringer surrounding the first column and a second stringer surrounding the second column.

18. The integrated circuit of claim 17, wherein the conductive material fills the first and second vias, and the one or more stringers are separated from the filled vias and from the thin film resistor material by the second dielectric material.

19. The apparatus of claim 11, wherein:
the second dielectric material comprises first and second columns containing at least part of the vias; and
the one or more stringers comprise a first stringer surrounding the first column and a second stringer surrounding the second column.

20. The apparatus of claim 19, wherein the conductive material fills the first and second vias, and the one or more stringers are separated from the filled vias and from the thin film resistor material by the second dielectric material.

* * * * *